United States Patent [19]
Blatt

[11] Patent Number: 5,408,176
[45] Date of Patent: Apr. 18, 1995

[54] MONITORING AND FAULT PROTECTION OF HIGH VOLTAGE SWITCH YARDS

[76] Inventor: David W. E. Blatt, 150 Andrew Road, Valentine, Australia

[21] Appl. No.: 585,101
[22] PCT Filed: Mar. 20, 1989
[86] PCT No.: PCT/AU89/00111
§ 371 Date: Nov. 13, 1990
§ 102(e) Date: Nov. 13, 1990

[30] Foreign Application Priority Data

Mar. 21, 1988 [AU] Australia ................ PI7351

[51] Int. Cl.$^6$ ............... G01R 19/00; G01R 1/20; G01R 31/02
[52] U.S. Cl. ................ 324/107; 324/127; 324/512; 364/483
[58] Field of Search ........... 324/127, 117 R, 117 H, 324/107, 512, 521; 364/483; 361/87, 93

[56] References Cited

U.S. PATENT DOCUMENTS

| | | |
|---|---|---|
| 3,312,898 | 4/1967 | Browne, Jr. |
| 3,418,575 | 12/1968 | Spindle et al. |
| 4,374,359 | 2/1983 | Missout |
| 4,408,155 | 10/1983 | McBride |
| 4,419,619 | 12/1983 | Jindrick et al. ............ 364/483 |
| 4,724,381 | 2/1988 | Crimmins |
| 4,855,671 | 8/1989 | Fernandes ............. 324/127 |

FOREIGN PATENT DOCUMENTS

| | | |
|---|---|---|
| 307729 | 3/1980 | European Pat. Off. |
| 20047 | 12/1980 | European Pat. Off. |
| 103151 | 8/1982 | European Pat. Off. |
| 125796 | 11/1984 | European Pat. Off. |
| 255505 | 2/1988 | European Pat. Off. |
| 59-126961 | 7/1984 | Japan |
| 61-264834 | 11/1986 | Japan |
| 61-289404 | 12/1986 | Japan |
| 63-136793 | 6/1988 | Japan |

OTHER PUBLICATIONS

"Control and Protection Systems for Switchgear," *Siemens Power Engineering & Automation VII* No. 3 (1985).
Pettinga, J. A. J. and Siersma, J., "A Polyphase 500kA Current Measuring System with Rogowski Coils," *IEEE Proc.* 130B:360–363 (1983).
PCT International Search Report, Ser. No.: PCT/AU 89/00111, Jul. 7, 1989.
PCT International Preliminary Examination Reports, first and second opinions, Dec. 14, 1989 and Feb. 13, 1990.
European Patent Office Supplementary Search Report, Ser. No.:-AU8900111, Jul. 15, 1991.

*Primary Examiner*—Ernest F. Karlsen
*Attorney, Agent, or Firm*—Townsend & Townsend Khourie & Crew

[57] ABSTRACT

The currents flowing through high voltage conductors in a network or switchyard are monitored by magnetic field sensors in the form of air-cored epoxy-filled coils which are electrostatically shielded by discontinuous shields. The magnetic field sensors are located a safe working distance away from the conductors being monitored to remain substantially at earth potential and are orientated to maximize the magnetic field influence from the conductors being monitored. The value of the magnetic field detected by the sensors are sampled instantaneously and the sampled value is processed, having regard to calibration and cross linking effects of the network being monitored to calculate the instantaneous current flowing through the network.

12 Claims, 4 Drawing Sheets

MONITORING AND FAULT PROTECTION OF HIGH VOLTAGE SWITCH YARDS

TECHNICAL FIELD

This invention relates to the monitoring of electrical currents flowing in conductors, and more particularly, to apparatus for monitoring a high voltage switchyard and for the detection of fault conditions therein.

BACKGROUND ART

The monitoring of high voltage electrical switchyards for revenue metering, instrumentation control, bus and line protection are generally carried out using current transformers. The current transformers are electrically connected to the high voltage conductors and therefore, are themselves high voltage devices which can and do develop faults resulting in damage to the switchyard.

Research into ways of eliminating the use of current transformers in the monitoring of high voltage currents has resulted in a number of alternatives being proposed. However, all of the proposed methods so far have the common feature requiring some form of attachment to the high voltage system being monitored. Most of the methods proposed are based on a transducer which uses the Faraday effect to monitor magnetic fields in a closed magnetic path around the conductor. However, due to the closeness of the coil to the conductor being monitored, the transducer is substantially at the same potential as the conductor.

DISCLOSURE OF INVENTION

The present invention relates to the use of magnetic field detectors which are physically and electrically isolated from the network under surveillance, and as the detectors are located a safe working distance from the high voltage conductors, the entire monitoring and protection system can be maintained at substantially earth potential.

Therefore, according to one aspect of the invention there is provided apparatus for monitoring currents flowing through a cable, said apparatus comprising:

a magnetic field detector placed in the vicinity of the cable but at a distance away therefrom to remain at substantially earth potential, said detector being electrically shielded by a discontinuous shield to isolate the detector from the effects of an electric field generated by the current flowing through the cable and able to be influenced by a magnetic field generated by the current flowing through the cable;

said detector producing an analogue signal representative of the strength of the magnetic field detected;

a remote station including a controller for receiving the signal from the detector and at predetermined instances of time, measuring the value of the analogue signal and converting that value to a digital signal; and a control centre including a CPU for determining the predetermined instances of time and for receiving and processing the digital signal to produce a final signal representative of the current flowing through the conductor.

According to a second aspect, the present invention provides apparatus for monitoring electrical currents flowing through conductors in a poly-faced network having junctions, comprising:

a plurality of magnetic field detectors arranged to detect magnetic fields generated by the electric currents flowing through the conductors, each conductor being electrically isolated from the conductors and shielded from electrical fields, wherein each detector produces an analogue signal representative of the magnetic field detected;

each detector having associated therewith a remote station, each remote station including a controller for receiving the analogue signal and at predetermined instances of time, measuring the value of the analogue signal and producing a second signal representative of the measured value of the analogue signal; and a control centre including a CPU for determining the instances in time and processing the second signals to calculate the currents flowing through the conductors of the network.

Preferably, the detectors are air cored epoxy potted coils with a discontinuous electrostatic shielding.

Preferably, each remote station converts the analogue signal to a digital signal which is sampled at the predetermined instances in time by a sample and hold circuit.

Preferably, the controller is a microprocessor.

Preferably, the second signal is relayed to the control centre as a current loop signal terminating at a varistor termination board within the control centre, the control centre also includes optoisolation means for optically isolating the second signal from the CPU.

Alternatively, the second signal may be relayed to the central centre by optical fibre.

BRIEF DESCRIPTION OF DRAWINGS

Notwithstanding any other forms that may fall within its scope, one preferred form of the invention will now be described, by way of example only, with reference to the accompanying drawings in which.

MODES FOR CARRYING OUT THE INVENTION

Figure 1:
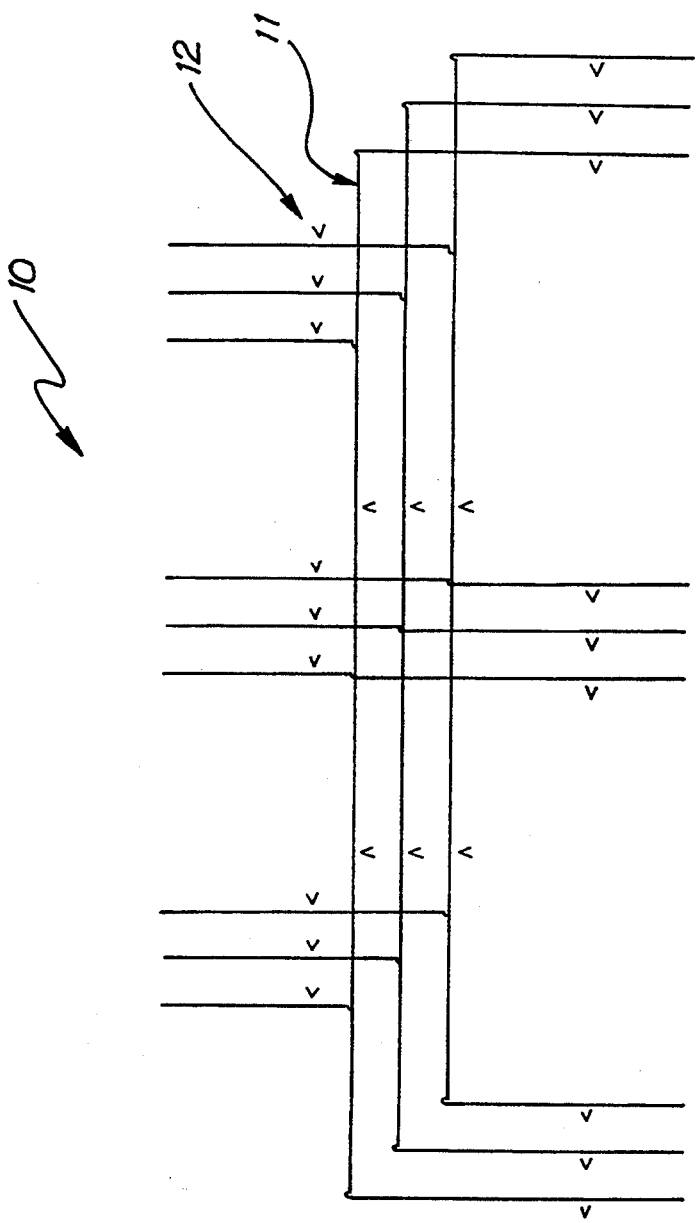
FIG. 1 illustrates the high voltage conductor circuit for a typical three phase high voltage switchyard.

The present invention uses magnetic field sensors which, although normally at ground potential and at a safe working distance from the high voltage system, are located within the high voltage area. The proximity to high voltage switching makes this an electrically noisy environment and appropriate shielding measures must be taken. Noise may be classed as two types, electrostatic and magnetic. Electrostatic noise can be eliminated by careful shielding. Magnetic noise is created by currents which are not part of the network under surveillance. Magnetic fields created by the currents under surveillance are the fields being monitored and thus are not considered to be noise. The large switching currents, which occur as high voltage circuit breakers are opened and closed, are genuine currents which need to be monitored, so magnetic fields due to this are also considered not to be noise. Therefore, currents in the low voltage control circuitry are of concern in eliminating magnetic interference and their effects may be minimised by sensible choice of sensor locations. Also, the control currents are generally an order of value smaller than the currents in the high voltage network.

As the magnetic fields in question are small, (of the order of tens of microTesla), it is preferable to do some signal conditioning close to the points of measurement. To obtain the required bandwidth and sensitivity, air-cored coils are used in the preferred embodiment of the invention as the initial sensors. The measurements need to be digitized for realtime processing, and all field measurements must be synchronized, so that the collected set of readings at each measurement event represents a time snapshot of the vector of magnetic fields, i.e. all measurements are taken at the same instance in time to provide an overall instantaneous view of the currents through the network. The timing constraint here is quite severe. Also, as the calculation of instantaneous currents from each snapshot is a linear process, we can in principle apply the same transformation on Fourier components of the measured magnetic fields to directly compute Fourier components of the currents. To give added flexibility and maintain as much precision as possible, microprocessors are provided within respective remote stations near each magnetic field sensor and the analogue to digital (A/D) conversion of magnetic field signals is carried out by the remote stations. This allows bursts of readings to be taken at accurately timed intervals, and stored briefly in the remote processors' memory, pending transmission back to the control computer at a slower rate.

The microprocessor remote stations are powered via the substation 50V battery supply, the same supply that is used for operation of critical protection circuitry. The supply is filtered and isolated. The remote stations are also connected radially back to a central control computer. In the preferred embodiment, this connection is via a modified current loop, generated at each remote station and sensed through optoisolated connections at the control room. This allows transmission of data from each outstation, in packets. After optoisolation, the data is fed to standard UARTs, which decode it ready for use in the control computer. The modification to each current loop consists of a second optoisolated switching transistor at the control room end, which can transmit a voltage pulse back to the remote station. By simultaneously transmitting this pulse to all remote stations, an accurate time reference is provided for each snapshot (or commencement of a burst of readings).

The pulse sent by the control computer determines the sync time for each snapshot via its leading edge. The duration of the pulse is used to encode the type of measurement event required. Thus, a range of measurement functions can be implemented in software (stored in ROM) at each remote station.

As the apparatus is required to operate continuously for long periods of time, basic protection and monitoring functions cannot be interrupted even momentarily during operator queries and disk logging activities. This necessitates careful design of the realtime software, and support by custom timing hardware, and this is also discussed in the following sections.

Preferably, the system should be capable of handling operator queries, displaying waveforms, logging current (and power) flows in various segments, and so on. The embodiment described here was developed with a DEC PDP 11/73 control computer running RT11, a realtime operating system which provides good support of interfacing to FORTRAN, the programming language used to implement higher level functions. In this way, only the time critical kernel of the system needs to be coded in assembly language.

By interfacing voltage transformer measurements to the control computer, instantaneous power flows can be calculated, giving Watts and Vars flowing in the network.

HARDWARE OVERVIEW

The preferred embodiment 20 will now be discussed in which the apparatus has been installed to monitor a typical 132KV switchyard network 10 having eight three phase conductors 11, as shown schematically in FIG. 1, which is approximately to scale as a plan view. The network 10 is divided into segments to be monitored as is the normal practice.

Sensing coils have been fixed at 24 locations, underneath each segment and oriented with horizontal coil normals in the "natural" direction, perpendicular to the overhead segment. The small vee's 12 in FIG. 1 indicate the (plan) position of each sensing coil below an overhead segment, with the orientation of the coil normal shown by the direction of the vee 12.

Each sensing coil 31 is electrostatically shielded and the shield is discontinuous around the circumference to avoid magnetic shielding. The coils are potted in epoxy, and connected via a low capacitance shielded twisted pair 32 to a respective remote station 30 situated in close proximity thereto.

Each remote station provides analogue signal conditioning, A/D conversion and control and communication circuitry. It can receive sync pulses and collect one or more accurately timed readings, which are then transmitted with error checking information back to a control computer 21.

The control computer 21 contains all the necessary interface hardware for the 24 remote stations 30, as well as interfacing to existing current transformers for comparison and calibration purposes.

Figure 2:
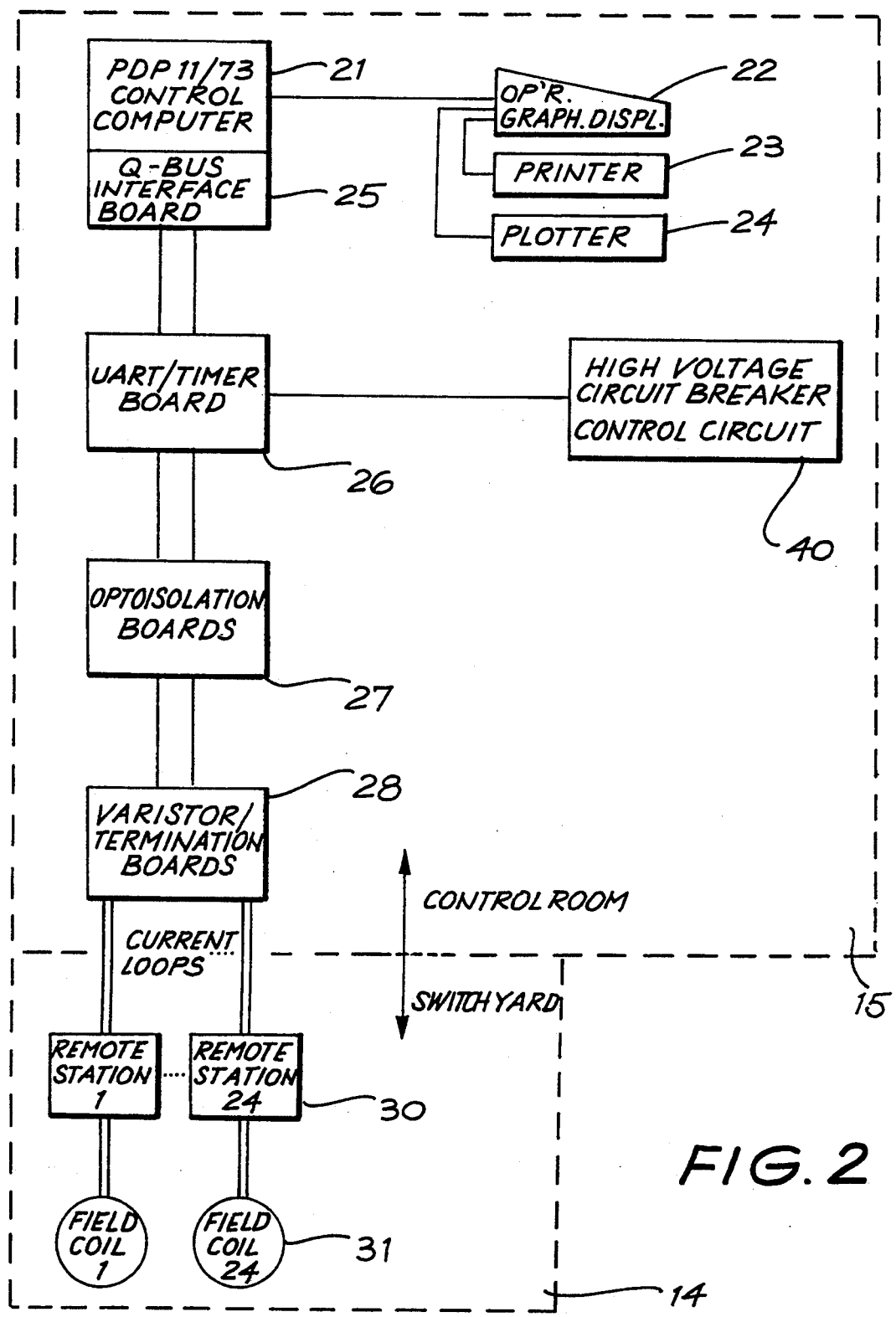
FIG. 2 illustrates in block diagram form the preferred embodiment of the present invention.
Figure 3:
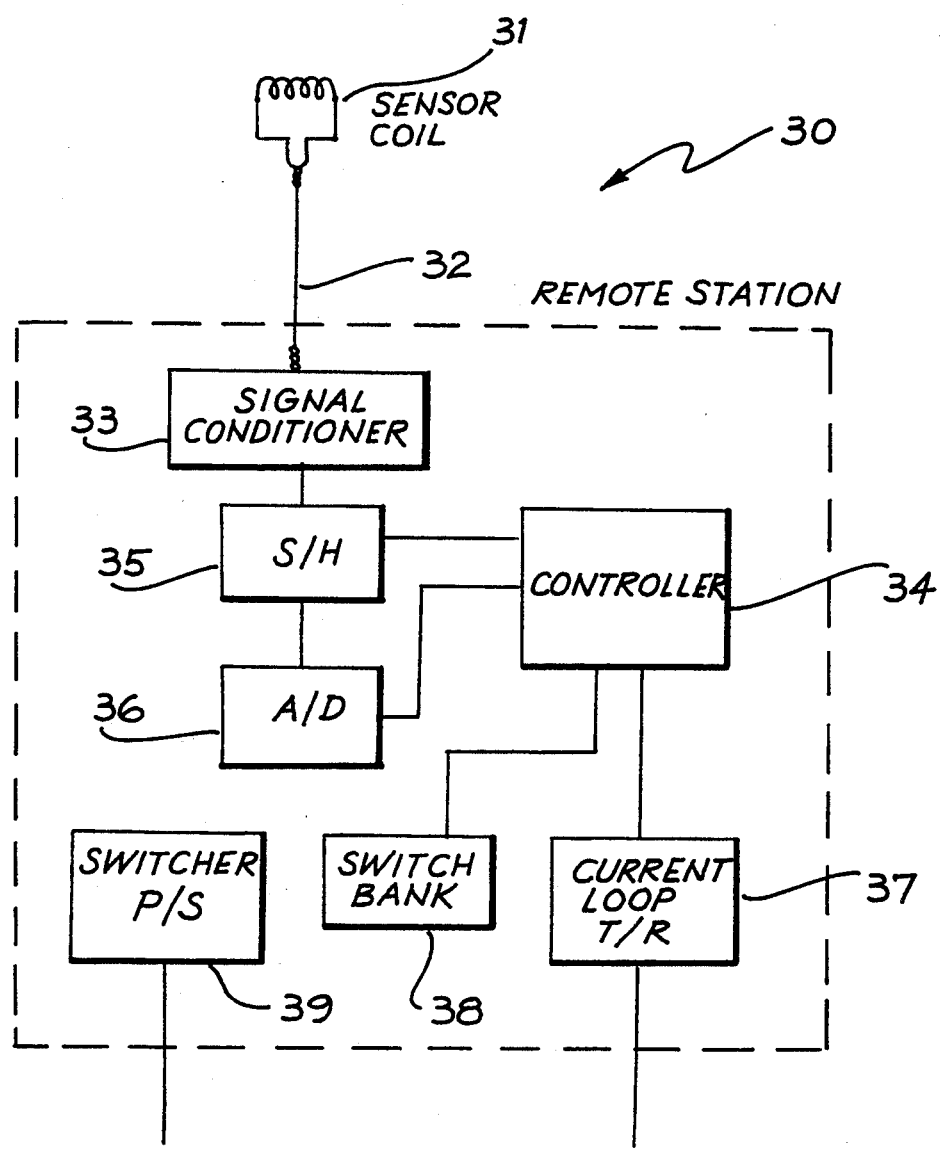
FIG. 3 is a block diagram of a remote station shown in FIG. 2.

FIG. 2 shows a block diagram of the system. We will now describe the functions of each component.

Control Computer

A PDP 11/73 processor is used as the control computer 21. In addition to time-of-day reference timing, available from the reference mains frequency, a standalone timer has been designed which locks to mains frequency when available but continues in free running mode during faults. This can provide reference timing and allow time stamping of all recorded events.

The operator's console 22 is a graphics terminal (Visual 550) allowing display of waveforms etc., and a printer 23 and plotter 24 are also attached to the system. The computer contains several custom interface boards, which are now described.

Q-Bus Interface Board (25)

This board uses a standard DEC chip set to handle interrupts and to memory map all the registers on the UART/Timer board 26, so that all the custom logic can be controlled by psedo-memory reads and writes.

UART/Timer Board (26)

This board provides 24 UART receivers for collecting the data from the remote stations 30. It also has a set of 6 programmable timers and some associated logic, using the line time reference clock, and generating the globally transmitted sync pulse. The timers are configured so as to allow various possible timing arrangements, from a single software-time sync pulse, to an automatic sequence of sync pulses, starting at the next line time clock edge, and separated by a specified amount. Furthermore, the duration of the sync pulses is controlled by a programmable timer, and an interrupt can be generated a controlled delay time after each sync pulse. The UARTs are quad-buffered, allowing receipt of 3 bytes of data without intervention. Thus, sync pulses can be automatically generated at uniform intervals throughout a period of the line frequency, and only interrupt for high priority processing when each channel is expected to have received its packet of data.

The individual bytes of data are hardware parity checked, and each packet contains an error check byte, so at interrupt time, checking the UART status and recomputing the error check byte gives a reliable indication of correct data transmission from the remote stations 30.

Optoisolation Boards (27)

Each of the 24 channels out to the switchyard 14 receives its data from an optoisolator in the current loop 29 generated by the remote station. Also, the sync pulse is optoisolated and fed into the current loop 29 as a voltage pulse (see (d) below).

Varistor/Termination Boards (28)

The current loop lines 29 coming in from the switchyard 14 are terminated onto these boards, and initial protection against overvoltage is provided here by varistors. Note that this is a routine precaution, even though the remote units are nominally at earth potential out in the switchyard.

Remote Stations (30)

Each of the 24 remote stations is controlled by an Intel 8749 microcomputer 34, with EPROM loaded software. It comprises:

(a) Field coil 31, connected via a shielded low capacitance cable 32, and signal conditioning. The input stage is overvoltage protected and has a matched integrator (RC =L/R of coil) so that its output tracks the magnetic flux linked, with contant (frequency independent) gain, rather than tracking its time derivative. The integrator of each remote station is trimmed using a square wave magnetic field in a test rig, followed by gain calibration prior to installation.

(b) Sample/Hold Unit 35. This freezes the desired magnetic field reading, ready for digitizing. In the quiescent state, the remote station is waiting for a sync pulse, and using its output ports to control logic, directs the sync pulse straight to the sample/hold unit, to provide an accurate reference time for the snapshot. The sync pulse also causes a software interrupt in the remote station, and allows software control of a timed burst of readings, commencing accurately at the reference sync time.

(c) A/D Converter 36. A 12 bit digitized reading is interfaced to the bus of the microcomputer 34, and read in as two bytes. Conversion time is approximately 25 microsec.

(d) Current Loop/Sync Detection 37. A 50 mA current loop is generated, under on/off control from the microcomputer. Under quiescent conditions, the current loop is on, waiting for a sync pulse. A zener diode at the far end of the loop causes a large voltage drop, and this is sensed by a comparator. The sync pulse causes a switching optotransistor to short out this zener, and the voltage pulse generated is detected by the comparator, providing the necessary reference timing. An A/D conversion is initiated immediately, and depending on sync pulse duration, which is now measured in software, one of a variety of measurement events is initiated. A data packet is assembled and transmitted back to the control computer 21 serially via the current loop 29.

(e) Switch Bank 38. An 8 position DIL switch allows station identification. It also provides power-up testing options for the remote stations.

(f) Switcher DC/DC Power Supply 39. The 50 VDC substation battery supply is isolated and DC—DC converted into $\pm 15V$ and 5 V supplies.

The complete remote station 30 is assembled on a printed circuit board, approximately 6×4 inches in size. It is mounted in a weather-proof diecast box, located near to its field coil 31.

Fibre optics is a practical option for the communication channel, simplifying the isolation of the units. The field coils and front ends may be redesigned to cater for a greater dynamic range and bandwidth of signal. The DC—DC switcher supplies 39, although made from discrete components, could be replaced by appropriate converters which are available as encapsulated units.

FIELD MEASUREMENT

Magnetic field values measured by the apparatus give instantaneous readings or snapshots of the fields due to the various current carrying conductors in the network being monitored. The currents are mainly sinusoidal, at 50 or 60 Hz. The fields present are linear superpositions of these currents, with proportionality constants fixed by the geometry. They are also influenced by the many ferrous structures usually present, but being typically of the order of microTesla, are well below the nonlinear region of these, and hence their influence can also be viewed as a fixed pseudo-geometric effect.

The result of superposing a set of sine waves is also a sine wave at the same frequency, with phase and amplitude changes. Furthermore, as the mapping from currents to fields is linear, we can treat each Fourier component separately if we so desire. At each measurement position, the field is actually a vector sum of the contributions from (nearby) current segments. A sensing coil 31 (or other field measuring device) will measure the dot product of the field with some fixed direction vector (in the case of a coil, the normal vector to the plane of the coil).

Although each sensor picks up contributions from all field sources, it is dominated by the nearest sources and if oriented so that its normal is aligned with the vector direction of this field, will maximise its contribution.

Note that in practical environments under consideration, most of the current carrying conductors 11 are straight line segments, and they are often arranged in a rectangular fashion. A coil oriented to pick up a field mainly from a conductor (or groups of conductors) in one direction will get no contribution from conductors in perpendicular directions.

Field sensors 31 can be placed at "safe working distances" from each conductor segment, and oriented to maximise the contribution from the nearby segments. Once they are in place, the calibration procedure will measure the (fixed) linear relationship required for real-time monitoring.

We refer to the N segment currents being monitored as $x_I(t)$, $I=1\ldots N$ and the N nearby magnetic field sensors as detecting fields $\mu_J(t)$, $J=1\ldots N$. The instantaneous currents are deduced from a linear mapping of instantaneous magnetic fields, given by a (constant) coupling matrix Q via the relation (see also under theoretical basis):

$$x_I = \sum_j Q_{IJ} \mu_J \qquad (1)$$

It is therefore important that the field measurements be referenced to the same instant t. For sinusoidal fields $\mu_J(t) = A_J \cos(\omega t + \phi_J)$, errors introduced by sampling at different instants t are given by the derivative $\mu'_J(t).\delta t$ which is in magnitude at most $A_J \omega.\delta t$. Relative to the amplitude of the field $A_j$, this represents an error of $\omega \delta t$ where $\omega = 2\pi.50$ sec$^{-1}$ (or $2\pi.60$ sec$^{-1}$). For 0.1% accuracy in measurements of $\mu_J$ this limits $\delta t$ to approximately 3$\mu$sec. We have attempted to reduce this source of error further by providing a synchronization pulse to all measuring stations, accurate to 0.5 $\mu$sec or better. Note that to reduce this error even further, it would be necessary to incorporate time corrections at each remote unit, as they are typically several hundred meters apart, and signal propagation times are of order 100 meters per microsecond. This correction could be done in software by interpolating between closely spaced readings of field, based on sync pulse arrival time and (fixed) spatial position.

Theoretical Basis

The network is divided into current segments by junctions. Normally, these segments occur in groups of three, corresponding to the phases of a three phase system. The aim of the apparatus is to measure the currents in each segment under no fault conditions and in the presence of a fault, locate the segment or junction at which the fault has occurred, and the nature of the fault (e.g. line → line between Blue and Yellow phases, etc).

Currents generate magnetic fields, and these are measured at a set of points around the switchyard by sensing coils. The number of these coils is chosen to be the same as the number of current segments, giving rise to a square coupling matrix mapping currents to fields. Note that this is not a limitation, as segments can be arbitrarily subdivided by introducing extra theoretical junctions, making protection zones as small as desired.

Coils are located at points near to each segment (but a safe working distance away), and of necessity measure magnetic field contributions from all nearby current segments, not just the nearest overhead segment. The coupling matrix is inverted (once only during the calibration process) to give a matrix which can be used to map a set of measured fields at any instant into a set of instantaneous currents.

Legal currents in the network are restricted to arbitrary linear combinations of a set of loop currents by Kirchoff's law. Thus for legal currents, the set of magnetic fields at any instant is not general. We will refer to the set of fields measured under no fault conditions as a legal set of fields. The above restriction means that not just one, but a whole (infinite) set of mapping matrices exists which will correctly map any legal set of fields to the corresponding currents. The calibration process allows us to select one matrix, called the Q matrix, to do this mapping.

The Q matrix is selected based on measured coupling between loop currents and magnetic fields, and constrained by theoretical estimates of segment current to magnetic field coupling, calculated from geometrical data on the switchyard layout. The constraints which are applied to the selection of the Q matrix are determined during calibration and not during the real time processing equation (1), i.e.

$$x_I = \sum_j Q_{IJ} \mu_J \qquad (1)$$

is the real time measurement equation. Q matrix is derived during calibration knowing that the instantaneous currents $x_I$ are related to the instantaneous loop currents l by the equation:

$$x_I = x_{ik} = \sum_\alpha \sigma_{i\alpha} l_{\alpha k} \qquad (2)$$

in which the matrix $\alpha$ in general contains only the values 1, −1, or 0. In equation (2), the index I runs from 1 to N, the total number of individual current segments, and is written equivalently as ik where $I = 3(i-1)+k$ with i equal "three-phase segment" (1..N/3) and k equals "colour" (1=red, 2=yellow, 3=blue). The summation index a equals 1..M runs over the chosen set of M linearly independent loops. Instantaneous field values denoted by $\mu_J(t)$ are related to the instantaneous currents by a coupling matrix and therefore can be related to the loop currents by:

$$\mu_J = \sum_{\alpha k} \Delta_{J,\alpha k} l_{\alpha k} \qquad (3)$$

which leads to:

$$\sum_J Q_{ik,j} \Delta_{J,\alpha k'} = \delta_{kk'} \sigma_{i\alpha} \qquad (4)$$

in which $\Delta_{J,\alpha k'}$ can be measured directly via equation (3), $\delta_{kk'}$ is the Kronecker delta (1 if k=k', 0 otherwise) and $\sigma_{i\alpha}$ is exactly known.

Q matrix can be chosen to satisfy equation (4) with as many zero elements as allowed to simplify the computation of equation (1) and also subject to keeping it as close as practical to a geometrically derived estimate.

The measured coupling $\Delta$ ensures that under no fault conditions, network or switchyard monitoring will give precise metering of all currents, while the constraint keeping the Q matrix close to a geometrically derived estimate ensures that during faults, the zone of the fault will be correctly identified.

Another important feature of the calibration process reduces the dynamic range of elements of the Q matrix, by forcing as many small elements to zero as possible. This has dual benefits. Firstly, it reduces the dynamic range requirements on the experimental magnetic field measuring stations, making increased precision possible. Secondly, having a large fraction of the elements of the Q matrix set to precisely zero means that far fewer multiplications need to be done to map a set of field readings to a set of currents. As this mapping is repeatedly done in realtime by the control computer, this represents an effective performance benefit.

It is important to note that selection of a Q matrix by the calibration process does not give rise to any loss of accuracy under no fault conditions, based on measured coupling between loop currents and fields. The calibration is done by an offline computer calculation of Q. Once the apparatus has been calibrated, Q is loaded into the control computer and online metering and fault checking can proceed in real time. With only modest investment in computer hardware, it is easy to do a complete calculation of currents and a self consistency check to locate faults many times per cycle at 50 or 60 Hz.

The calculation of currents is done by taking instantaneous measurements of the magnetic fields and multiplying this by the Q matrix.

The fault checking consists of:
(i) calculation of net external currents to network and algebraic sum of currents at junctions;
(ii) least squares fit of currents $x_I$ to give best set of equivalent loop currents $l_{ak}$ and hence a set of fitted currents $\hat{X}_j$ which can be compared to $x_I$.

Both (i) and (ii) can be done online in considerably less time than the calculation of $x_I$. All the sums in (i) and all the differences $\hat{X}_I - \hat{x}_I$ in (ii) will be zero in a no-fault situation. The external current sums, quickly to reveal the nature of the fault (line-line, line-ground etc., and which phase), while the remaining information reveals the nearest junction and segment to the fault, and gives an indication of the magnitude of both fault currents and normal currents elsewhere in the switchyard.

SOFTWARE OVERVIEW

Initial development concentrated on creating a measurement and calibration system, and allowing display of waveforms. This preceded the development of the realtime control system, which uses the relationship (1) to compute the vector of 24 currents after each snapshot, then does fault checking.

For calibration purposes, it is desirable to measure the vector of instantaneous currents $x_I, I = 1 \ldots N$ and the vector of instantaneous fields $\mu_j$, $J = 1 \ldots N$ as accurately as possible, for a set of configurations of the currents. If we assume that steady state sine waves are present during calibration, a sequence of measurements can be made and fitted to a sine wave to improve accuracy. Although the remote stations are capable of taking a burst of readings, the interfacing to the existing CTs for calibration purposes is somewhat simpler, and with only one A/D converter for all channels, is not capable of reading a burst of vectors. We therefore used sampling techniques to achieve the same end.

Figure 4:
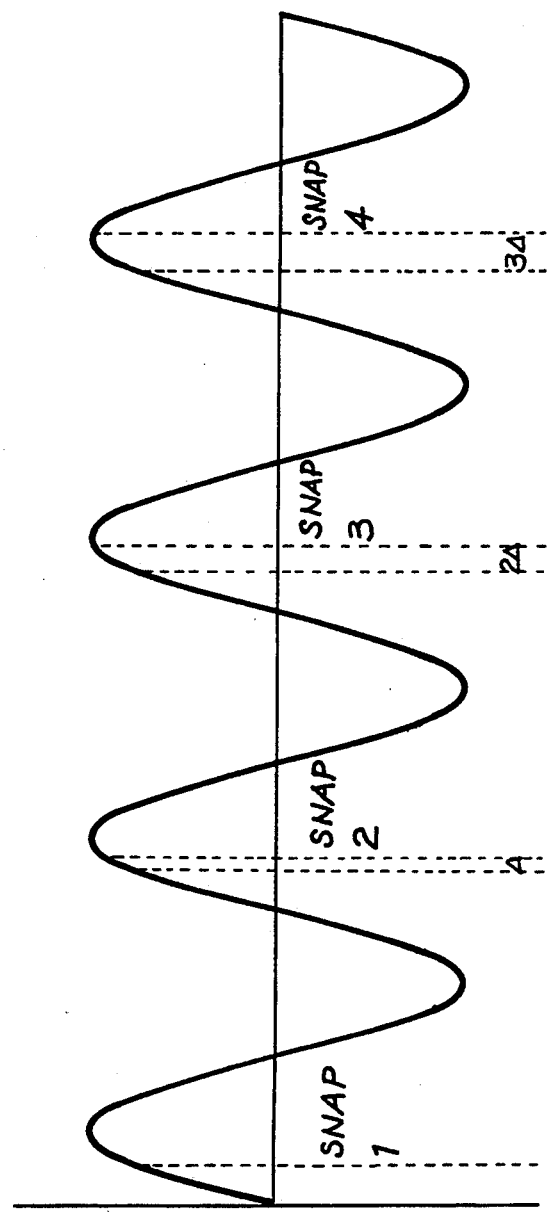
FIG. 4 illustrates how a current wave form picture can be built from sampled data.

FIG. 4 shows how snapshots were taken at a sequence of points offset by increasing amounts $\Delta$, $2\Delta$, $3\Delta$. . . from a reference phase, so as to build up a sampled picture of the channel. In fact, 50 such snapshots are taken, spaced at $\Delta = 1$ mSec, and then a least squares fit was done for each channel to give the vector of currents and the vector of fields used for calibration in each configuration. The control software for calibration runs is able to log all readings to disk, and display waveforms, least squares fits and residuals for any selected channel.

Realtime control software has also been developed for the control computer. This uses the RT11 realtime operating system. A (time critical) foreground process collects the vector of field readings after each snapshot, does the Q matrix multiplications to produce a current vector via (1), and then does fault checking. Any faults detected would naturally be used to trigger existing bus protection relays etc., if this system were used to control the switchyard.

The foreground process is set up with the Q matrix built into it. The Q matrix is calculated by a larger computer offline from the calibration data. Multiplication by the Q matrix (equation (1)) is the most time consuming part of this real time process. Things are greatly helped by making the Q matrix as sparse as possible as any zero elements of Q require no processing. To minimize multiplication time, the Q matrix generated offline is piped through a code generator utility which produces a machine code subroutine tailored for this particular Q matrix, doing only the necessary multiplications. To minimize overall time, all the loops are "unrolled" and all nonzero Q matrix elements are built into the code as constants.

After each snapshot is taken, both the vector of fields directly read in and the vector of currents generated by the Q matrix multiplication are stored in one time stamped frame of a large circular buffer. The PDP 11/73 can accept and process at least 6 snapshots per cycle at 50 Hz. Increasing this with faster hardware would be straightforward and relatively inexpensive. At present we keep only the last 50 snapshots in our circular buffer, but this could easily be increased to thousands by adding more memory to the control computer. The size of this circular buffer determines the amount of pre-history available at fault time, and this pre-history could be saved and analyzed later to study the onset of faults.

A background (low priority) process interfaces to the operator. It can take a copy of the current state of the whole circular buffer being generated by the foreground process, and then let the operator inspect this in various ways, at leisure. The operator can display magnetic field or current waveforms, looking either at full screen displays, or looking at up to four selected channels as smaller displays, one in each of the four quadrants. Multiple channels can also be superposed on each display, and hard copy printout facilities are available. It would be a straightforward matter to arrange for a variety of information to be available to the operator, or logged to disk, by altering the background process software to suit.

The timing of each snapshot is in principle arbitrary, but it is useful for monitoring purposes to build up a detailed picture of the waveforms over a few cycles. The high priority foreground process sets up the hardware registers so that it will automatically be interrupted after each of 6 evenly spaced snapshots in each cycle. However, the offset from the start of the reference cycle to the first of this sequence of 6 readings is varied slightly from cycle to cycle, so that over a period of several cycles, a sampled picture of the waveform can be built up.

I claim:

1. Apparatus for monitoring electrical currents flowing through a plurality of spaced-apart conductors forming part of a high voltage poly-phase network of conductors, comprising:

a plurality of magnetic field detectors arranged to detect the magnetic fields generated by electric currents flowing through the plurality of conductors, each detector being physically and electrically isolated from the conductors and shielded from electrical fields generated by each of said conductors, each of said conductors having at least one detector being disposed proximate to said conductor, each of said detectors being arranged to measure the magnetic field generated by all of said plurality of conductors, wherein each detector produces an analogue signal representative of the magnetic fields detected;

each detector having associated therewith a receiving station, each receiving station including a controller for receiving the analogue signal and, at predetermined instances of time, measuring the value of the analogue signal and producing a second signal representative of the measured value of the analogue signal; and a control center including a CPU for determining the instances in time and processing the plurality of second signals to calculate the currents flowing through the plurality of conductors.

2. Apparatus as defined in claim 1, wherein the control center uses a matrix to calculate the currents flowing through the plurality of conductors from the plurality of second signals.

3. Apparatus as defined in claim 1, wherein said control center includes means for determining the existence of a fault along a length of any one of said conductors of said network and means responsive to said fault determination means for signalling a fault condition.

4. Apparatus as defined in claim 3, wherein the CPU includes means responsive to said signalling means for indicating a nature of the fault.

5. Apparatus as defined in claim 3, wherein the CPU comprises means responsive to said signalling means for identifying a location of the fault.

6. Apparatus as defined in claim 3, wherein said CPU comprises means responsive to said signalling means for calculating a magnitude of the fault.

7. Apparatus as defined in claim 1, wherein said detectors are comprised of air-cored, epoxy-potted coils with a discontinuous electrostatic shielding.

8. Apparatus as defined in claim 1, wherein each of said receiving stations comprises a respective sample and hold circuit for sampling a respective analog signal at the predetermined instances of time and for converting said analog signal into a digital signal.

9. Apparatus as defined in claim 1, wherein the control center further comprises termination board within the control center and optoisolation means for optically isolating the second signal from the CPU.

10. Apparatus as defined in claim 1, wherein said means for processing the plurality of second signals takes into account cross linking of magnetic fields detected by the detectors.

11. An apparatus as claimed in claim 1 wherein a detector is located proximate to one of said spaced-apart conductors so that a normal vector of said detector is aligned with a vector direction of the magnetic field generated by said one conductor so as to maximize the detection of the magnetic field generated by said one conductor and to minimize the detection of magnetic fields generated by the other, spaced-apart conductors.

12. Apparatus for monitoring electrical currents flowing through three conductors forming part of a high voltage three-phase network of conductors, comprising:

at least three magnetic field detectors arranged to detect the magnetic fields generated by electric currents flowing through said three conductors, each of said at least three detectors being physically and electrically isolated from said three conductors and shielded from electrical fields generated by each of said three conductors, each of said at least three detectors being disposed so as to measure the magnetic field generated by all of said three conductors and for producing an analogue signal representative of the magnetic fields detected;

each detector having associated therewith a receiving station, each receiving station including a controller for receiving the analogue signal and, at predetermined instances of time, measuring the value of the analogue signal and producing a second signal representative of the measured value of the analogue signal; and a control center including a CPU for determining the instances in time and processing the plurality of second signals to calculate the currents flowing through the three conductors.

* * * * *